(12) United States Patent
Steinkamp et al.

(10) Patent No.: US 10,244,604 B2
(45) Date of Patent: Mar. 26, 2019

(54) LIGHTING DEVICE

(71) Applicant: PMDTechnologies AG, Siegen (DE)

(72) Inventors: Bernhard Steinkamp, Siegen (DE); Holger Bette, Lennestadt (DE)

(73) Assignee: PMDTechnologies AG, Siegen (DE)

( * ) Notice: Subject to any disclaimer, the term of this patent is extended or adjusted under 35 U.S.C. 154(b) by 0 days.

(21) Appl. No.: 15/547,159

(22) PCT Filed: Jan. 22, 2016

(86) PCT No.: PCT/EP2016/051382
§ 371 (c)(1),
(2) Date: Jul. 28, 2017

(87) PCT Pub. No.: WO2016/120176
PCT Pub. Date: Aug. 4, 2016

(65) Prior Publication Data
US 2018/0014377 A1   Jan. 11, 2018

(30) Foreign Application Priority Data
Jan. 30, 2015  (DE) .................. 10 2015 101 424

(51) Int. Cl.
*H05B 37/02* (2006.01)
*F21V 25/04* (2006.01)
(Continued)

(52) U.S. Cl.
CPC .............. *H05B 37/02* (2013.01); *F21S 41/16* (2018.01); *F21V 23/0457* (2013.01);
(Continued)

(58) Field of Classification Search
USPC ............................................ 362/257–311.15
See application file for complete search history.

(56) References Cited

U.S. PATENT DOCUMENTS

| 4,980,809 A | 12/1990 | Baldwin |
| 2007/0164302 A1* | 7/2007 | Tanda ................... H01L 33/486 257/98 |

(Continued)

FOREIGN PATENT DOCUMENTS

| CN | 101479635 | 7/2009 |
| CN | 102042549 | 5/2011 |

(Continued)

*Primary Examiner* — Matthew Mikels
(74) *Attorney, Agent, or Firm* — Marsh Fischmann & Breyfogle LLP; Jonathon A. Szumny

(57) ABSTRACT

The present invention concerns a lighting device comprising a source for generating electromagnetic radiation, and a beam shaper which is so arranged and adapted that in operation of the lighting device it spatially expands the electromagnetic radiation issuing from the source. In comparison therewith the object of the present invention is to provide such a lighting device which ensures eye safety even when the beam shaper is detached or damaged. For that purpose it is proposed according to the invention that the lighting device has a sensor which is so adapted that in operation of the lighting device it detects a state of the beam shaper, wherein the sensor and the source are so operatively connected together and adapted that if during operation of the lighting device the state of the beam shaper changes in such a way that electromagnetic radiation could issue from the lighting device without the beam shaper being in the beam path of the electromagnetic radiation the source is switched off.

11 Claims, 2 Drawing Sheets

(51) Int. Cl.
  *H01S 5/00*    (2006.01)
  *H01S 5/068*   (2006.01)
  *F21V 23/04*   (2006.01)
  *F21S 41/16*   (2018.01)

(52) U.S. Cl.
  CPC .............. *F21V 25/04* (2013.01); *H01S 5/005* (2013.01); *H01S 5/06825* (2013.01)

(56) References Cited

U.S. PATENT DOCUMENTS

| | | | |
|---|---|---|---|
| 2009/0296018 A1 | 12/2009 | Harle | |
| 2011/0084609 A1 | 4/2011 | Kawaguchi | |
| 2013/0211608 A1* | 8/2013 | Farrell | G06F 1/26 700/286 |
| 2014/0009952 A1* | 1/2014 | Nomura | H01S 5/00 362/509 |
| 2014/0226210 A1* | 8/2014 | Moriwaki | G02B 1/11 359/601 |
| 2014/0334167 A1* | 11/2014 | Tiefenbacher | B60Q 1/143 362/465 |

FOREIGN PATENT DOCUMENTS

| | | |
|---|---|---|
| CN | 104245423 | 12/2014 |
| DE | 102006029203 | 12/2007 |
| DE | 102008016461 | 10/2009 |
| DE | 102009005547 | 7/2010 |
| EP | 1260844 | 11/2002 |
| JP | 2013191479 | 9/2013 |
| TW | 201246734 | 11/2012 |
| WO | 2013096984 | 7/2013 |

\* cited by examiner

LIGHTING DEVICE

BACKGROUND

1. Field of the Invention

The invention concerns a lighting device comprising a source for generating electromagnetic radiation, and a beam shaper which is so arranged and adapted that in operation of the lighting device it spatially expands the electromagnetic radiation issuing from the source.

2. Relevant Background

Laser radiation but also electromagnetic radiation from light emitting diodes has generally desirable properties which can be selected and adjusted in specifically targeted fashion for various applications. These are in particular high intensity, the emission of monochromatic light, sharp focusing of the beam and a large coherence length.

It is precisely the potentially high intensity with sharp focusing however that involves a risk potential. If a living being passes into the electromagnetic radiation long-lasting injury to skin and eyes cannot be excluded. Numerous solutions for ensuring eye safety are therefore known from laser technology.

Whenever a directed or concentrated radiation is not required beam shapers, for example optical diffusers or dispersion elements which diffusely scatter the radiation upon reflection or transmission of the electromagnetic radiation generated by the source are used.

If the source is a semiconductor laser or a light emitting diode those diffusers can be inexpensively glued on to the discharge facet of the source and then ensure uniform diffuse emission of the radiation emitted by the source, with a desired emission characteristic.

In that respect however there is still the danger of the beam shaper becoming detached due to mechanical or also thermal influences, and this can also occur during ongoing operation of the source. There is then the danger that the source remains switched on and radiation at a high level of intensity issues from the lighting device, and that is capable of injuring or damaging the skin or a human or animal eye.

SUMMARY

In comparison therewith the object of the present invention is to provide a lighting device of the kind set forth in the opening part of this specification, which ensures eye safety even when the beam shaper is detached or damaged.

At least one of the above-mentioned objects is attained by a lighting device comprising a source for generating electromagnetic radiation, and a beam shaper which is so arranged and adapted that in operation of the lighting device it spatially expands the electromagnetic radiation issuing from the source, and wherein the lighting device has a sensor which is so adapted that in operation of the lighting device it detects a state of the beam shaper, wherein the sensor and the source are so operatively connected together and adapted that if during operation of the lighting device the state of the beam shaper changes in such a way that electromagnetic radiation could issue from the lighting device without the beam shaper being in the beam path of the electromagnetic radiation the source is switched off.

The idea of the present invention is to use a sensor to detect a disruption in the structure of the lighting device, that entails the risk that electromagnetic radiation emitted by the source issues from the lighting device in a condition of not being expanded or diffusely scattered so that eye safety can no longer be ensured.

In an embodiment of the invention such a change in the state of the lighting device, that entails that danger, is in particular detachment of the beam shaper from the lighting device so that the beam shaper moves relative to the source in such a way that electromagnetic radiation can issue from the source and leave the lighting device before it has been expanded by the beam shaper.

In an embodiment however such an eye-endangering state of the lighting device also occurs when the beam shaper is damaged, for example it breaks or parts thereof break off.

The present invention is basically suitable for all types of sources for electromagnetic radiation. It enjoys its advantages however in particular in relation to sources with a very high emitted spatial power density like lasers or light emitting diodes.

While the present invention is suitable for all types of sources, in particular semiconductor lasers, the source in an embodiment is a semiconductor laser in the form of a vertical-cavity surface-emitting laser (VCSEL) in which the light is emitted perpendicularly to the plane of the semiconductor chip. Such a vertical-cavity surface-emitting laser on the one hand involves lower manufacturing costs than conventional edge-emitting emitters. On the other hand the beam profile of a vertical-cavity surface-emitting laser is better compared to an edge-emitting emitter. Vertical-cavity surface-emitting lasers are available in narrow-band form and can possibly be tuned in their wavelength.

The term beam shaper which spatially expands the electromagnetic radiation is used in accordance with the present invention to denote any optical element which is capable of altering a beam in such a way that its power per surface area is reduced. Examples of such beam shapers are scattering elements, beam-shaping diffusers, diffractive elements and microlens arrays or combinations thereof.

In particular a suitable beam shaper is a combined element comprising a diffractive element and a microlens array. Such elements are also referred to as engineered diffusers. Such elements which in particular are produced in one piece are commercially available for example from CDA, Suhl, Germany. The beam profile which can be generated with such an element can be selected almost as desired prior to the manufacturing process.

A scattering element in accordance with the present application is an optical component which upon reflection or transmission of electromagnetic radiation scatters it diffusely, that is to say statistically in a plurality of spatial directions.

In an embodiment of the invention the beam shaper is an element through which the electromagnetic radiation is transmitted.

In an embodiment a beam shaper has glass or plastic. Holographic methods but also etching, (sand) blasting or grinding processes are suitable for the manufacture of such a beam shaper.

A beam shaper is arranged in the beam path of the electromagnetic radiation in front of the emission surface of the source and is fixed there.

In an embodiment of the invention the beam shaper is secured by adhesive to the source, that is to say preferably to the chip of the semiconductor laser or the light emitting diode.

A first group of embodiments of the lighting device according to the invention, as are described hereinafter, requires a control means which is electrically operatively connected to the source and the sensor in such a way that the current required for emission of electromagnetic radiation from the source does not flow by way of the sensor. Rather, the control means detects a control signal from the sensor and then switches the current for the source.

In contrast a second group of embodiments of the lighting device according to the invention is of such a nature that the current required for the emission of electromagnetic radiation from the source flows by way of the sensor. In such an embodiment the sensor is preferably a switch which interrupts the flow of current by way of the source when it is opened. The use of a control means is then unnecessary in an embodiment.

The term control means for the source is used in the present application to denote an electrical circuit, including a microprocessor circuit, which is capable of providing for open-loop or closed-loop control of the current flowing through the source or the voltage applied to the source.

In an embodiment of the invention a control means is so adapted that, when the sensor detects that the state of the lighting device changes in such a way that there is the risk of electromagnetic radiation issuing from the lighting device without having been altered by the beam shaper, the control means triggers an alarm. In an embodiment manual intervention on the part of a user is then required, who for example switches off the lighting device.

In an embodiment of the invention the control means is so adapted that it prevents emission of electromagnetic radiation from the source if the sensor detects that the state of the lighting device has changed in such a way that there is the danger of electromagnetic radiation issuing from the lighting device without it having been scattered at the scattering element.

For that purpose the control means in an embodiment of the invention is so adapted that, when a disruption state is detected by means of the sensor, the control means electrically switches off the source so that it no longer emits electromagnetic radiation. In another embodiment the control means can be so adapted that it controls a power supply unit for the source, wherein when there is the danger of electromagnetic radiation issuing from the lighting device without having been altered by the beam shaper the control means prevents the power supply unit from switching on the source.

In an alternative embodiment, in the situation where the sensor detects a disruption state, the control means causes closure of a shutter closure so that electromagnetic radiation can no longer issue from the lighting device.

In an embodiment of the invention the sensor is a capacitive sensor which is so adapted and arranged that it detects a position of the scattering element or a position of a protective cap for the scattering element, as is described in detail hereinafter.

When the beam shaper is arranged in a position intended for same the capacitive sensor involves a different capacitance than if the scattering element has moved from its position intended for same.

If the beam shaper or the protective cap comes away, whereby the capacitance of the capacitive sensor changes, the change in capacitance is detected. The structure of such a capacitive sensor is known in many different forms from the state of the art.

In that respect, in an embodiment of the invention, the sensor is a capacitor which is electrically operatively connected to the control means, the capacitance of which changes if a dielectric or also a conducting material is moved into the proximity of the capacitor. In that case it may be sufficient if the beam shaper comprises a dielectric material which influences the capacitance of the capacitor.

In an embodiment of the invention the beam shaper however has an electrically conducting portion which also changes the capacitance of the capacitor if that electrically conducting portion is arranged in the proximity of the capacitor.

In an alternative embodiment of the invention the sensor is an electric switch which is so adapted and arranged that the switch is closed if the beam shaper or a protective cap for the scattering element is arranged at a position of the lighting device, that is intended for same.

In such an embodiment it is particularly desirable if the current required for generation of the electromagnetic radiation in the source, in operation of the lighting device, flows by way of that sensor which is in the form of a switch. Opening of the switch which indicates a critical operating state then automatically terminates the emission of electromagnetic radiation from the source. In such an embodiment a separate control means is not necessarily required.

In an embodiment the switch has two electric contacts electrically connected to the control means, and an electrically conducting portion at the beam shaper, wherein the electrically conducting portion of the beam shaper is in engagement with the electric contacts in such a way that in operation of the lighting device when the scattering element is arranged at the position provided for same in the lighting device, a current can flow by way of the electric contacts and the electrically conducting portion of the beam shaper.

If the beam shaper comes loose in such an embodiment then the electrically conducting portion of the beam shaper lifts off the contacts and the switch is opened. Opening of the switch is detected by an interruption in the flow of current by way of the contacts and the electrically conducting portion of the beam shaper.

In an embodiment the electrically conducting portion of the beam shaper is soldered to the contacts.

In an embodiment of the invention the lighting device has a protective cap having an opening through which in operation of the lighting device the electromagnetic radiation generated by the source can issue, wherein the protective cap is so adapted and arranged that it at least portion-wise surrounds the source and the beam shaper in such a way that the protective cap limits a movement of the beam shaper relative to the source in such a way that in operation of the device even after detachment of the beam shaper the electromagnetic radiation emitted by the source and issuing from the protective cap through the opening is completely expanded by the beam shaper.

Expressed in other terms the protective cap serves as a catching device for the beam shaper. Even when for example a bonded connection of the beam shaper to the source fails the beam shaper provides that the beam shaper cannot move with respect to the source in such a way that it no longer or no longer completely implements its expanding action for the electromagnetic radiation emitted by the source in operation of the lighting device.

In an embodiment of the invention the protective cap has an electrically conducting portion and the sensor has two contacts electrically connected to the control means, wherein the contacts and the electrically conducting portion of the protective cap form a switch, by way of which in operation of the lighting device a current can flow when the protective cap is arranged at the position provided for same so that the electrically conducting portion closes the switch.

In such an embodiment the protective cap affords a double safeguard against the emission of unscattered electromagnetic radiation from the lighting device.

On the one hand, if the beam shaper becomes detached from the source, the protective cap prevents it moving relative to the source in such a way that unexpanded radiation can issue from the lighting device.

On the other hand mechanical damage to the protective cap itself, which moves the protective cap out of its intended position, has the result that the sensor detects that damage and the control means triggers a suitable alarm or switches off the source.

In an embodiment of the invention the protective cap is made from metal, in particular a solderable metal, preferably brass. When such a protective cap of metal is brought into engagement with the contacts of the sensor and preferably soldered thereto, it is possible in that way to implement a simple switch which is opened when the protective cap tears away from the carrier material, in particular a circuit board.

In an embodiment a protective cap has in particular the advantage that it makes it possible to provide the protective device upon system integration. In other words, sources with beam shapers provided thereon can still be commercially acquired and only then is the protective cap fitted after the actual circuit board has been set up.

In an embodiment the protective cap is in particular of such a configuration that the current required in operation of the lighting device for generation of the electromagnetic radiation in the source can be taken by way of the protective cap or its electrically conducting portion.

In an embodiment of the invention the lighting device has a circuit board on which the source and contacts or electrodes of the sensor are disposed.

In an embodiment of the invention the sensor has two electric contacts electrically connected to the control means and an electrically conducting portion at the beam shaper itself, wherein the contacts and the electrically conducting portion of the beam shaper form a switch, by way of which in operation of the lighting device a current can flow when the electrically conducting portion of the beam shaper is arranged at the position provided for same.

Such an embodiment has the advantage that it can manage without an additional protective cap and is capable of directly detecting detachment of the scattering element.

Embodiments of the invention in which an electrically conducting portion of the beam shaper itself forms a part of a switch as the sensor typically require a control means as greater currents, as are required for driving the electromagnetic emission of the source, cannot be taken by way of electrically conducting coatings on the beam shaper.

In an embodiment it is possible to provide an electrically conducting portion on the beam shaper with a planar, electrically conducting coating which is nonetheless transparent for the emitted electromagnetic radiation. Such a coating for example comprises indium-tin oxide (ITO).

An embodiment which is desirable for the present invention however is one in which provided on the beam shaper is a path comprising an electrically conducting coating which is non-transparent for the electromagnetic radiation and which is so arranged that it does not cover regions on the beam shaper so that electromagnetic radiation can be emitted from the lighting device through those regions.

In an embodiment that conductive path covers a large part of the surface of the beam shaper. In an embodiment the conductive path is desirably of a meander-shaped configuration. In an embodiment of the invention the electrically conductive path on the surface of the beam shaper looks like the conductor path configuration of a rear window heating assembly of a motor vehicle.

If it is assumed that breakage of the beam shaper or other damage also has the result that the electrically conductive path on the surface of the beam shaper is damaged, then upon damage to the beam shaper the resistance of the conductive path on the surface of the beam shaper changes. In an embodiment that change in resistance is detected and processed by the control means.

In a further embodiment of the invention the electrically conducting portion on the beam shaper is applied to a plastic film. In an embodiment such a film can be easily glued to the beam shaper to simplify assembly.

Further advantages, features and possible uses of the present invention will be apparent from the description of embodiments hereinafter and accompanying Figures.

BRIEF DESCRIPTION OF THE DRAWINGS

In the Figures identical elements are denoted by the same references.

DETAILED DESCRIPTION

Figure 1:
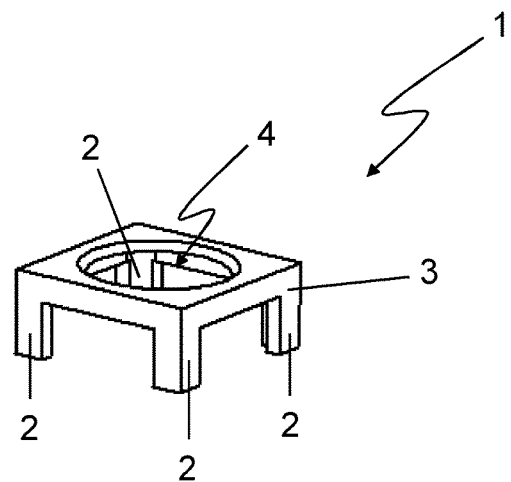
FIG. 1 shows a perspective view of a protective cap according to the invention for a lighting device.

FIG. 1 is a perspective view of a protective cap 1 according to the invention for a lighting device having a semiconductor laser and a scattering element. The protective cap 1 has four support feet 1 with which the protective cap 1 in the mounted condition is supported on contacts or contact surfaces provided for same of a circuit board. In addition the protective cap 1 has a frame element 3 connecting the support feed 2 together. The frame element has an opening 4, from which in operation of the lighting device the electromagnetic radiation generated by the semiconductor laser issues from the lighting device.

Figure 2:
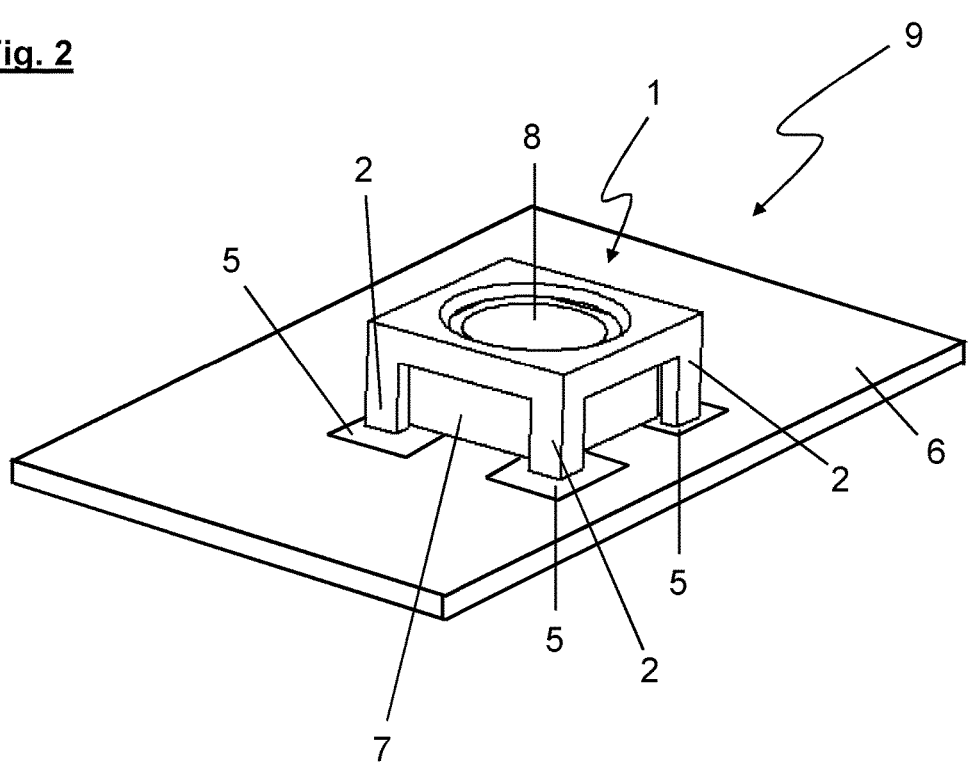
FIG. 2 shows the protective cap of FIG. 1 in the mounted state.

FIG. 2 shows the protective cap 1 in the mounted state on a circuit board 6. The feet 2 of the protective cap 1 are soldered to contacts 5 provided for same on the circuit board 6. In the mounted state the protective cap 1 surrounds the actual semiconductor laser 7, in the illustrated embodiment, a vertical-cavity surface-emitting laser, and a scattering element 8 arranged on the emission surface of the vertical-cavity surface-emitting laser 7. In this case the protective cap 1 is of such dimensions that it receives both the semiconductor laser 7 and also the scattering element 8 in its interior.

In the illustrated embodiment the scattering element 8 is glued to the emitting surface of the semiconductor laser 7. In this case the protective cap 1 is of such dimensions that, if the adhesive bond between the scattering element 8 and the semiconductor laser 7 fails, the scattering element 8 cannot fall out of the opening 4. In addition the frame element 3 of the protective cap 1 limits lateral movement of the scattering element 8 relative to the semiconductor laser 7 in such a way that, even upon maximum displacement of the scattering element 8, no radiation can issue from the protective cap 1 past the scattering element 8.

In other words when the protective cap 1 is fixed it ensures that electromagnetic radiation emitted by the semiconductor laser 7 is always transmitted through the scattering element before it issues from the lighting device.

In accordance with the present application the lighting device 9 embraces all elements which are to be seen in the view in FIG. 2.

In the illustrated embodiment the scattering element 8 is an etched glass pane which upon the transmission of electromagnetic radiation through the scattering element 8 causes diffuse scattering of the radiation so as to ensure eye safety in respect of the semiconductor laser 7.

In the illustrated embodiment the protective cap 1 is made from brass so that it is electrically conductive. That makes it possible to use the protective cap 1 as a constituent part of an electrical circuit, by way of which in operation of the semiconductor laser 7 the current required for the emission of the electromagnetic radiation can be taken.

Besides the protective cap 1 the switch is also formed by two of the contacts 5 on the circuit board 6. In the illustrated embodiment these are two diagonally opposite contacts 5. Those contacts 5 are electrically conductingly connected to the semiconductor laser 7 in such a way that during operation of the lighting device, an electric current flows by way of the contact surfaces 5, the protective cap 1 and through the semiconductor laser 7. The switch is then closed.

If however, for example due to a mechanical effect, the protective cap 1 comes loose from the circuit board 6, the switch is then opened. That state directly results in no current flowing through the semiconductor laser 7 so that the emission of electromagnetic radiation no longer occurs. The switch serves as an interlock for the semiconductor laser 7.

Figure 3:
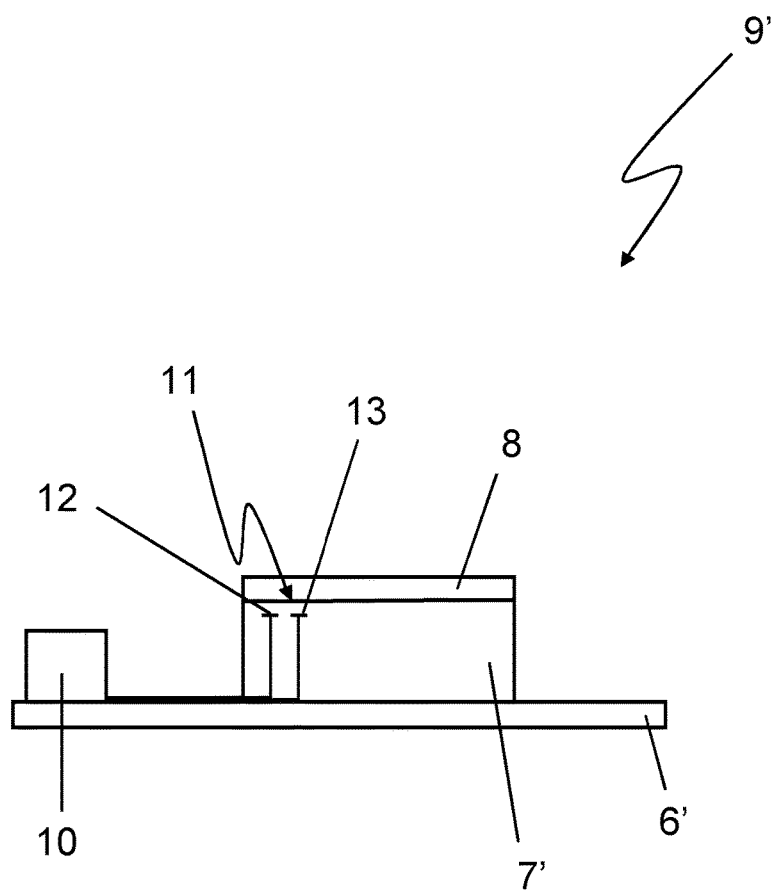
FIG. 3 shows a diagrammatic sectional view through an alternative embodiment of the lighting device according to the invention.

FIG. 3 shows an alternative embodiment in which the interlock according to the invention for the semiconductor laser 7' is not implemented by a cap embracing the semiconductor laser 7' and the scattering element 8. Rather, this embodiment involves a capacitive sensor 11 arranged in the semiconductor laser 7' itself. This capacitive sensor comprises two capacitor electrodes 12, 13 in plate form, which are connected to the control means 10 by way of conductor paths. The capacitance of the capacitor formed by the electrodes 12, 13 depends on what material is arranged in the environment of the electrodes 12, 13.

As before the scattering element 8 comprises an etched glass, that is to say a dielectric material. If the scattering element 8 becomes detached from the semiconductor laser 7' the capacitance of the capacitor formed by the electrodes 12, 13 changes. That change in capacitance is detected by the control means 10 and as a consequence of the change in capacitance the control means 10 switches off the semiconductor laser 7. This also effectively prevents electromagnetic radiation from issuing from the lighting device 9' without having passed through the scattering element 8.

For the purposes of the original disclosure it is pointed out that all features as can be seen by a man skilled in the art from the present description, the drawings and the claims, even if they are described in specific terms only in connection with certain other features, can be combined both individually and also in any combinations with other of the features or groups of features disclosed here insofar as that has not been expressly excluded or technical aspects makes such combinations impossible or meaningless. A comprehensive explicit representation of all conceivable combinations of features is dispensed with here only for the sake of brevity and readability of the description.

While the invention has been described and illustrated in detail in the drawing and the preceding description that illustration and description is only by way of example and is not deemed to be a limitation on the scope of protection as defined by the claims. The invention is not limited to the disclosed embodiments.

Modifications in the described embodiments are apparent to the man skilled in the art from the drawings, the description and the accompanying claims. In the claims the word "have" does not exclude other elements or steps and the indefinite article "a" does not exclude a plurality. The mere fact that certain features are claimed in different claims does not exclude the combination thereof. References in the claims are not deemed to be a limitation on the scope of protection.

LIST OF REFERENCES 1 protective cap
2 support feet
3 frame element
4 opening
5 contact
6 circuit board
7, 7' semiconductor laser
7' semiconductor laser
9, 9' lighting device
11 capacitive sensor
12, 13 capacitor electrodes

What is claimed is:
1. A lighting device (9, 9') comprising
a source (7, 7') for generating electromagnetic radiation, and
a beam shaper (8) which is so arranged and adapted that in operation of the lighting device (9, 9') it spatially expands the electromagnetic radiation issuing from the source (7, 7'),
characterised in that
the lighting device (9, 9') has a sensor (11) which is so adapted that in operation of the lighting device it detects a state of the beam shaper (8),
wherein the sensor (11) and the source (7, 7') are so operatively connected together and adapted that if during operation of the lighting device (9, 9') the state of the beam shaper (8) changes in such a way that electromagnetic radiation could issue from the lighting device (9, 9') without the beam shaper (8) being in the beam path of the electromagnetic radiation the source (7, 7') is switched off,
wherein the lighting device (9, 9') has a protective cap (1) having an opening (4) through which, in operation of the lighting device (9, 9'), the electromagnetic radiation generated by the source (7, 7') can issue,
wherein the protective cap (1) is so adapted and arranged that it at least portion-wise surrounds the source (7, 7') and the beam shaper (8) in such a way that the protective cap (1) limits a movement of the beam shaper (8) relative to the source (7, 7') so that in operation of the device, even after a change in position of the beam shaper (8), the electromagnetic radiation emitted by the source (7, 7') and issuing from the protective cap (1) through the opening is completely expanded at the beam shaper (8),
wherein the protective cap (1) forms a catching device for the beam shaper (8) such that the beam shaper (8) cannot move with respect to the source (7, 7') in such a way that it no longer or no longer completely implements its expanding action for the electromagnetic radiation emitted, and wherein the protective cap (1) has an electrically conductive portion and the sensor has the protective cap (1) and two electric contacts (5) connected to the control means (10), and wherein the contacts (5) and the electrically conducting portion of the protective cap (1) form a switch, by way of which a current flows in operation of the lighting device if the protective cap (1) is arranged at the position intended for same.

2. A lighting device (9, 9') according to claim 1 characterised in that the sensor (11) is an electric switch which is so adapted and arranged that the switch is closed if the beam shaper (8) or a protective cap (1) for the beam shaper (8) is arranged at a position of the lighting device (9, 9') intended for the beam shaper or the protective cap, wherein preferably the switch is electrically connected to the source (7, 7') in such a way that in operation of the lighting device (9, 9') a current required for generation of the electromagnetic radiation in the source (7, 7') flows by way of the switch.

3. A lighting device (9, 9') according to claim 1 characterised in that the protective cap (1) is made from an electrically conductive material.

4. A lighting device (9, 9') according to claim 1 characterised in that the electrically conducting portion of the protective cap (1) is soldered to the contacts (5).

5. A lighting device (9, 9') according to claim 1 characterised in that the lighting device (9, 9') has a circuit board (6) on which the source (7, 7') and the contacts (5) of the sensor are arranged.

6. A lighting device (9, 9') according to claim 1 characterised in that the lighting device (9, 9') has a control means (10) which is electrically connected to the source (7, 7') and which is operatively connected to the sensor in such a way that a current required for generation of the electromagnetic radiation in the source (7, 7') does not flow by way of the sensor, wherein the control means (10) is so adapted that in operation of the lighting device (9, 9') it prevents electromagnetic radiation from issuing from the lighting device (9, 9') if the sensor (11) signals that the state of the lighting device (9, 9') has changed in such a way that there is the danger that electromagnetic radiation issues from the lighting device (9, 9') without it having been shaped at the beam shaper (8).

7. A lighting device (9, 9') according to claim 6 characterised in that the sensor has two electric contacts (5) electrically connected to the control means (10) and an electrically conducting portion at the beam shaper (8), wherein the electrically conducting portion of the beam shaper (8) is in engagement with the electric contacts (5) in such a way that in operation of the lighting device (9, 9') a current can flow by way of the electric contacts (5) and the electrically conducting portion.

8. A lighting device (9, 9') according to claim 7 characterised in that the electrically conducting portion at the beam shaper (8) forms an electrically conductive path on the surface of the beam shaper (8).

9. A lighting device (9, 9') according to claim 7 characterised in that the electrically conducting portion is applied to a plastic film which is applied to the beam shaper (8).

10. A lighting device (9, 9') according to claim 7 characterised in that the electrically conducting portion of the beam shaper (8) comprises an electrically conducting material which is non-transparent to electromagnetic radiation, wherein the electrically conductive portion is so arranged that a part of the beam shaper (8) is uncovered so that electromagnetic radiation can pass the beam shaper (8).

11. A lighting device (9, 9') according to claim 6 characterised in that the sensor (11) is a capacitive sensor (11) which is so adapted and arranged that it detects a positioning of the beam shaper (8) or a protective cap (1) for the beam shaper (8).

\* \* \* \* \*